United States Patent
Umemoto

(10) Patent No.: US 7,078,629 B2
(45) Date of Patent: Jul. 18, 2006

(54) MULTILAYER WIRING BOARD

(75) Inventor: Kazuhiro Umemoto, Shiga-pref (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/711,638

(22) Filed: Sep. 29, 2004

(65) Prior Publication Data

US 2005/0087364 A1    Apr. 28, 2005

(30) Foreign Application Priority Data

Oct. 22, 2003   (JP)   ............................. 2003-362361

(51) Int. Cl.
*H05K 1/16*   (2006.01)
(52) U.S. Cl. .................................... 174/260
(58) Field of Classification Search ................ 174/260
See application file for complete search history.

(56) References Cited

U.S. PATENT DOCUMENTS 5,484,963 A * 1/1996 Washino ..................... 174/261

FOREIGN PATENT DOCUMENTS

| JP | 09102517 A | 5/1995 |
| JP | 09-102517 | * 4/1997 |
| JP | 2002-110712 | 12/2002 |

* cited by examiner

*Primary Examiner*—Kamand Cuneo
*Assistant Examiner*—Yuriy Semenenko
(74) *Attorney, Agent, or Firm*—Ira D. Blecker

(57) ABSTRACT

To prevent, in a multilayer wiring board to which a semiconductor chip is flip-chip bonded, occurrence of cracks in the board at portions adjacent to electrode pads due to a difference in thermal expansion coefficient between the semiconductor chip and the board. A multilayer wiring board (20) of the present invention has features that electrode pads (22) corresponding to electrodes of a semiconductor chip (25) located near an outer periphery (29) of the semiconductor chip each have an oblong shape, openings (35) of a solder resist (23) are each smaller than the oblong shape, and the center (B) of the opening is located to be offset from the center (A) of the oblong shape by a distance (L4) in a direction (30) toward the center of the semiconductor chip. Therefore, in the multilayer wiring board of the present invention, thermal stresses applied to portions (L3) of the electrode pads (22) on the board near the outer periphery of the semiconductor chip are relaxed. Consequently, the multilayer wiring board of the present invention can prevent occurrence of cracks in the board at portions adjacent to the electrode pads near the outer periphery of the semiconductor chip due to a difference in thermal expansion coefficient between the semiconductor chip and the board.

4 Claims, 2 Drawing Sheets

MULTILAYER WIRING BOARD

FIELD OF THE INVENTION

The present invention generally relates to a printed wiring board and, more specifically, relates to a multilayer wiring board on which a semiconductor chip is mounted by flip-chip bonding.

BACKGROUND ART

The flip-chip bonding is a technology of joining a semiconductor chip to electrodes on a board using solder. The flip-chip bonding is also called C4 bonding. FIG. 1 is a diagram showing the state of a semiconductor chip and a multilayer wiring board after they are flip-chip bonded together according to a conventional technique. The multilayer wiring board is a board having wiring layers and insulating layers that are stacked alternately. The multilayer wiring board is also called a multilayer board or a build-up board. Electrode pads 3 are formed on the surface of an insulating layer 2 being an uppermost layer of a multilayer wiring board 1. Each of the electrode pads 3 is located so as to correspond to an associated one of electrodes of a semiconductor chip 5. The board 1 is covered with a solder resist 6 except at flip-chip bonded joints 4 of the electrode pads 3. At openings of the solder resist 6 on the surfaces of the electrode pads 3, the electrodes of the semiconductor chip 5 and the electrode pads 3 of the board 1 are electrically connected to each other by the flip-chip bonded joints 4 being solder joints. For reinforcing the joining between the semiconductor chip 5 and the board 1, a resin 7 called an underfill is filled between the semiconductor chip 5 and the board 1.

The multilayer wiring board 1 with the semiconductor chip 5 flip-chip bonded thereto is subjected to a temperature cycle test for checking reliability against variation in temperature. In the temperature cycle test, cracks identified by numeral 10 in FIG. 1 are generated in the board 1 at portions adjacent to the electrode pads 3. The cracks 10 occur due to a difference in thermal expansion coefficient between the semiconductor chip 5 and the board 1. The cracks 10 occur particularly at those electrode pads 3 located near an end surface 111 of the semiconductor chip 5. The cracks 10 do not occur in a central direction 12 of the semiconductor chip 5. The reason why the cracks 10 occur at those electrode pads 3 near the end surface 11 of the semiconductor chip 5 is that large stresses are concentrated around the end surface 11 of the semiconductor chip 5 upon cooling in the temperature cycle. These stresses are caused by the difference in thermal expansion coefficient between the semiconductor chip 5 and the multilayer board 1. The cracks 10 having once occurred propagate in the board 1 to thereby cut a wiring layer in the multilayer board 1 beneath the electrode pads 3. As a result, operation failure (disconnection) of a circuit in the multilayer wiring board 1 is induced.

JP-A-H09-102517 discloses a technique for preventing cracks from occurring in solder bumps due to a difference in thermal expansion coefficient between a semiconductor element and a printed board. In this publication, electrodes of the semiconductor element on which the solder bumps are placed each have an elongated oval shape extending in an expansion direction of the semiconductor element. As a result, a joint area of each solder bump in the expansion direction of the semiconductor element is increased to relax concentration of stresses to the root of the solder bump.

This publication, however, discloses the technique for preventing occurrence of the cracks in the solder bumps, and does not disclose a technique for preventing occurrence of the cracks 10 (FIG. 1) in the board 1 at the portions adjacent to the electrode pads 3.

SUMMARY OF THE INVENTION

It is an object of the present invention to, in a multilayer board to which a semiconductor chip is flip-chip bonded, prevent cracks from occurring in the multilayer board at portions adjacent to electrode pads due to a difference in thermal expansion coefficient between the semiconductor chip and the multilayer board.

It is another object of the present invention to, in a multilayer board to which a semiconductor chip is flip-chip bonded, improve reliability of the multilayer board against variation in temperature by reducing occurrence of operation failure (disconnection) of a circuit in the multilayer board caused by the variation in temperature.

The present invention is a multilayer wiring board adapted to receive a semiconductor chip to be soldered thereto, comprising an insulating layer; a plurality of electrode pads provided on the insulating layer so that each of the electrode pads is located corresponding to an associated one of a plurality of solder bumps of the semiconductor chip to be soldered; a solder resist covering the insulating layer and the electrode pads; openings provided in the solder resist covering the electrode pads, each of the openings reaching a surface of the electrode pad; and solder filled into the openings of the solder resist, wherein each of the electrode pads corresponding to the solder bumps located near an outer periphery of the semiconductor chip to be soldered has an oblong shape, each of the openings of the solder resist is smaller than the oblong shape, and a center of the opening is located to be offset from a center of the oblong shape in a direction toward a center of the semiconductor chip to be soldered.

The present invention is a multilayer wiring board with a semiconductor chip mounted thereon, comprising an insulating layer; a plurality of electrode pads on the insulating layer; a solder resist cover the insulating layer and the electrode pads; openings provided in the solder resist covering the electrode pads, each of the openings reaching a surface of the electrode pad; the semiconductor chip having a plurality of electrodes each arranged to correspond to an associated one of the electrode pads; and solder joints filling the openings, respectively, each of the solder joints connecting the corresponding one of the electrode pads to the corresponding one of the electrodes of the semiconductor chip, wherein each of the electrode pads corresponding to the electrodes located near an outer periphery of the semiconductor chip has an oblong shape, each of the openings of the solder resist is smaller than the oblong shape, and a center of the opening is located to be offset from a center of the oblong shape in a direction toward a center of the semiconductor chip.

In the multilayer wiring board of the present invention, each of the electrode pads corresponding to the solder bumps or electrodes located near the foregoing outer periphery has an oval shape, and each of the openings of the solder resist has a circular shape.

The multilayer wiring board of the present invention has the features that the electrode pads corresponding to the electrodes of the semiconductor chip located near the outer periphery of the semiconductor chip each have the oblong shape, the openings of the solder resist are each smaller than the oblong shape, and the center of the opening is located to be offset from the center of the oblong shape in the direction toward the center of the semiconductor chip. Therefore, in the multilayer wiring board of the present invention, thermal stresses applied to portions of the electrode pads on the board near the outer periphery of the semiconductor chip are relaxed. Consequently, the multilayer wiring board of the present invention can prevent occurrence of cracks in the board at portions adjacent to the electrode pads near the outer periphery of the semiconductor chip due to a difference in thermal expansion coefficient between the semiconductor chip and the board.

The multilayer wiring board of the present invention has a low possibility of disconnection failure of its circuit caused by cracks that occur due to the difference in thermal expansion coefficient, and therefore, has a high reliability against variation in temperature.

DETAILED DESCRIPTION

Figure 2:
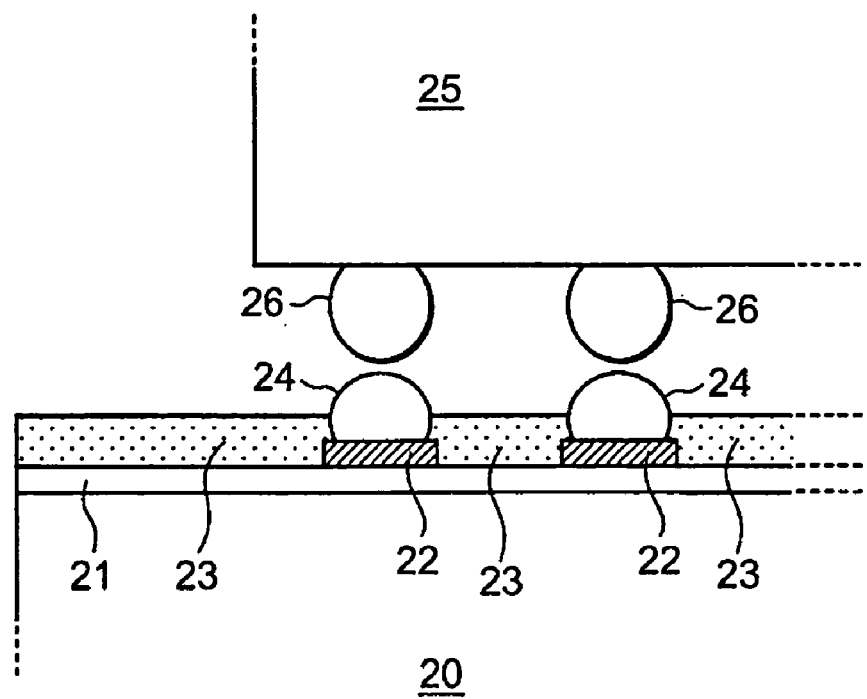
FIG. 2 is a diagram showing the state of a semiconductor chip and a multilayer wiring board before they are flip-chip bonded together according to the present invention.

FIG. 2 is a diagram showing the state of a semiconductor chip and a multilayer wiring board before they are flip-chip bonded together according to the present invention. The multilayer wiring board is a board having wiring layers and insulating layers that are stacked alternately. The multilayer wiring board is also called a multilayer board or a build-up board. Electrode pads 22 are formed on the surface of an insulating layer 21 being an uppermost layer of a multilayer wiring board 20. Each of the electrode pads 22 is located so as to correspond to an associated one of solder bumps 26 of a semiconductor chip 25. The electrode pads 22 are formed by a normal process, for example, by patterning (photolithography) after copper plating. The board 20 is covered with a solder resist 23 except at flip-chip bonding portions of the electrode pads 22. Openings of the solder resist 23 are formed by a normal process, for example, by patterning (photolithography) after the application of the solder resist 23. Each of the openings of the solder resist 23 on the surfaces of the electrode pads 22 is formed with an OSP protective film for preventing generation of rust and filled with a solder 24. Solder used for the solder bumps 26 and the solders 24 may be of any type such as a Pb—Sn solder or a Pb-free solder.

Figure 3:
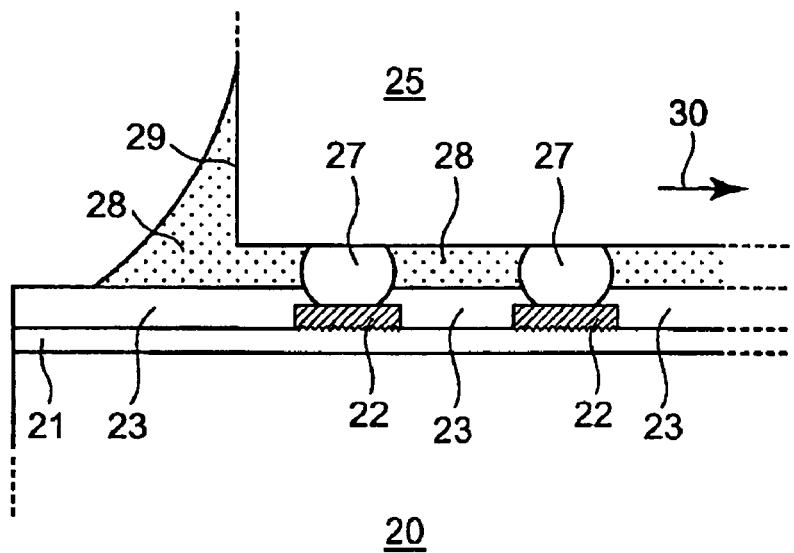
FIG. 3 is a diagram showing the state of the semiconductor chip and the multilayer wiring board after they are flip-chip bonded together according to the present invention.

FIG. 3 is a diagram showing the state of the semiconductor chip 25 and the multilayer wiring board 20 after they are flip-chip bonded together according to the present invention. In a reflow soldering process, the solders 24 of the board 20 and the solder bumps 26 of the semiconductor chip 25 shown in FIG. 2 are melted to thereby form solder joints 27 as shown in FIG. 3. The semiconductor chip 25 and the electrode pads 22 of the board 20 are electrically connected to each other by the solder joints 27. For reinforcing the joining between the semiconductor chip 25 and the board 20, a resin 28 called an underfill is filled between the semiconductor chip 25 and the board 20.

Figure 4:
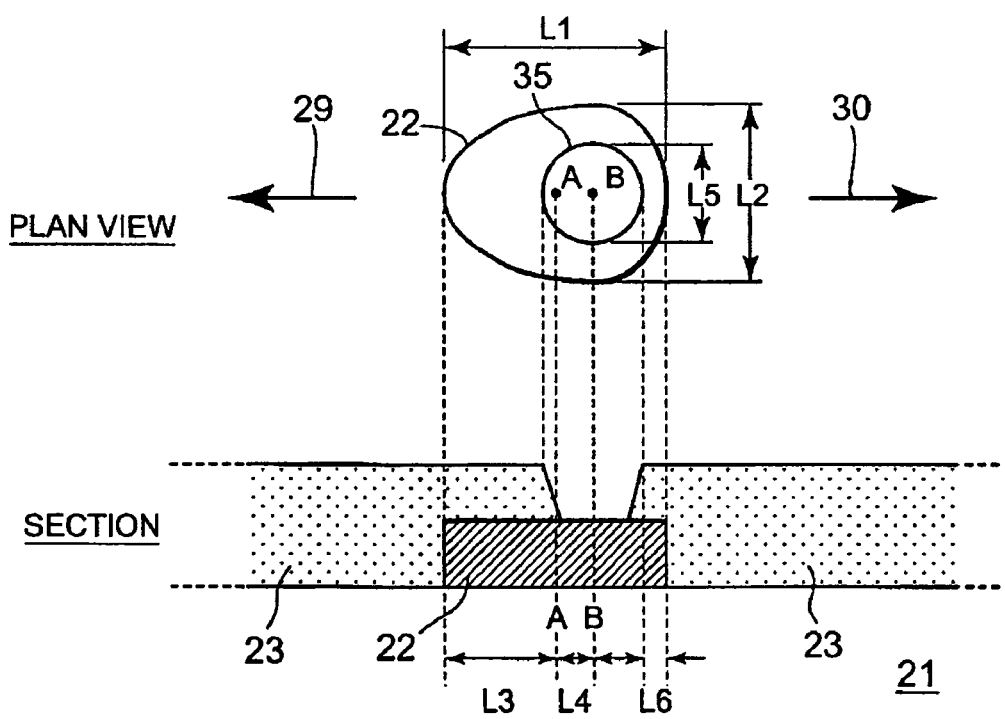
FIG. 4 is a diagram showing the state of an electrode pad of the multilayer wiring board corresponding to an electrode of the semiconductor chip located at a position near an outer periphery of the semiconductor chip, according to the present invention.

FIG. 4 is a diagram showing the state of the electrode pad 22 corresponding to an electrode of the semiconductor chip 25 located at a position near an outer periphery (end surface) 29 (see FIG. 3) of the semiconductor chip 25. As seen from a plan view in FIG. 4, the electrode pad 22 has an oblong shape extending in a direction toward the outer periphery 29 of the semiconductor chip 25. The electrode pad 22 has an oval shape in the example of FIG. 4, but is not limited to such a shape, i.e. it may have another shape such as a rectangular shape as long as the shape is oblong. Numeral 35 denotes the opening of the solder resist 23 on the electrode pad 22. The opening 35 has a circular shape in the example of FIG. 4, but is not limited to such a shape, i.e. it may have another shape such as a square shape or an oval shape.

An area of the opening 35 is smaller than that of the electrode pad 22 as seen from the plan view in FIG. 4. The center B of the opening 35 is located to be offset from the center A of the electrode pad 22 in a direction 30 toward the center of the semiconductor chip 25. As a result, the electrode pad 22 becomes much larger in area than the opening 35 in the direction toward the outer periphery (end surface) 29 of the semiconductor chip 25. That is, a portion (L3) of the electrode pad 22, which is not subjected to the soldering, is ensured outside the opening 35 in the direction toward the outer periphery (end surface) 29 of the semiconductor chip 25.

Figure 1:
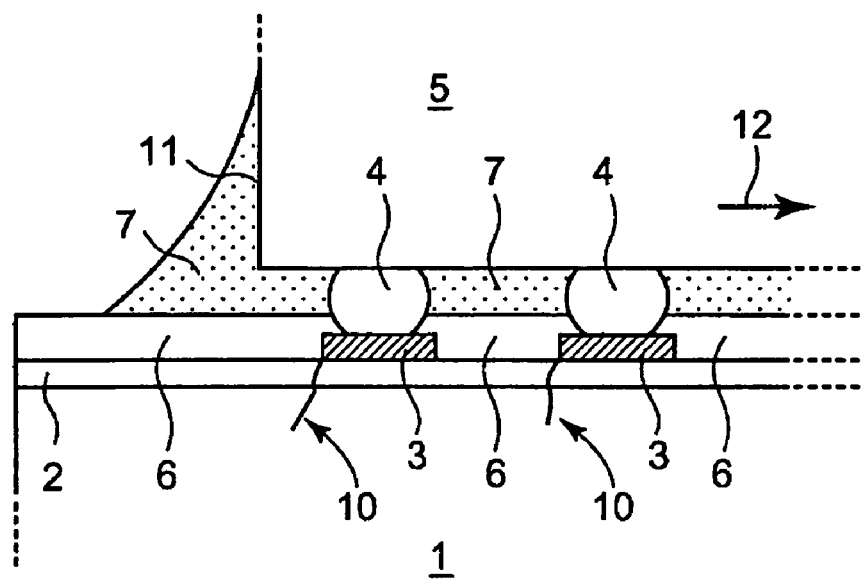
FIG. 1 is a diagram showing the state of a semiconductor chip and a multilayer wiring board after they are flip-chip bonded together according to a conventional technique.

Owing to the increase in area of the electrode pad 22 that is not subjected to the soldering in the direction toward the outer periphery 29 of the semiconductor chip 25, a thermal stress applied to the electrode pad 22 is relaxed (dispersed). Consequently, it is possible to prevent occurrence of a crack 10 (see FIG. 1) which would be otherwise caused in the multilayer board 20 at a portion adjacent to the electrode pad 22 due to a difference in thermal expansion coefficient between the semiconductor chip 25 and the multilayer board 20. The position of the center B of the opening 35 is determined based on parameters such as a size of the electrode pad 22, a size of the opening 35, and a magnitude of the thermal stress, but it is at least necessary that the center B of the opening 35 is located to be offset from the center A of the electrode pad 22 in the direction 30 toward the center of the semiconductor chip 25.

EXAMPLE

A multilayer wiring board 20 after the flip-chip bonding, having an electrode pad 22 with the shape shown in FIG. 4, was actually prepared. Dimensions (L1 to L6 in FIG. 4) of the electrode pad 22 were as follows. The unit of the dimensions is micrometer.

Lateral Length of Pad 22: L1=160 to 220

Longitudinal Length of Pad 22: L2=140 to 160

Diameter of Opening 35: L5=100

Interval between Center A of Pad 22 and Center B of Opening 35: L4=10 to 40

Interval between End of Opening 35 and End of Pad 22: L6=20 to 30

The prepared multilayer wiring board 20 was subjected to a temperature cycle test (1250 cycles between −55° C. and 125° C.). As a result, it was confirmed that cracks corresponding to the cracks 10 shown in FIG. 1 did not occur at all.

What is claimed is:

1. A multilayer wiring board adapted to receive a semiconductor chip to be soldered thereto, comprising:
   an insulating layer;
   a plurality of electrode pads provided on said insulating layer so that each of said electrode pads is located corresponding to an associated one of a plurality of solder bumps of the semiconductor chip to be soldered;
   a solder resist covering said insulating layer and said electrode pads;
   openings provided in said solder resist coveting said electrode pads, each of said openings reaching a surface of the electrode pads; and
   solder filled into the openings of said solder resist,
   wherein each of the electrode pads corresponding to the solder bumps located near an outer periphery of the semiconductor chip to be soldered has an oblong shape,
   each of the openings of said solder resist is smaller than said oblong shape, and
   a center of said opening has a fixed location with respect to a center of said oblong shape so as to be offset from the center of said oblong shape in a direction toward a center of the semiconductor chip to be soldered.

2. A multilayer wiring board according to claim 1, wherein each of the electrode pads corresponding to the solder bumps located near said outer periphery has an oval shape, and each of the openings of said solder resist has a circular shape.

3. A multilayer wiring board with a semiconductor chip mounted thereon, comprising:
   an insulating layer;
   a plurality of electrode pads on said insulating layer;
   a solder resist covering said insulating layer and said electrode pads;
   openings provided in said solder resist covering said electrode pads, each of said openings reaching a surface of the electrode pad;
   the semiconductor chip having a plurality of electrodes each arranged to correspond to an associated one of said electrode pads; and
   solder joints filling said openings, respectively, each of said solder joints connecting the corresponding one of said electrode pads to the corresponding one of said electrodes of said semiconductor chip,
   wherein each of the electrode pads corresponding to the electrodes located near an outer periphery of said semiconductor chip has an oblong shape,
   each of the openings of said solder resist is smaller than said oblong shape, and
   a center of said opening has a fixed location with respect to a center of said oblong shape so as to be offset from the center of said oblong shape in a direction toward a center of said semiconductor chip, said solder joints correspondingly have a fixed location with respect to the center of said oblong shape so as to be offset from the center of said oblong shape in a direction toward the center of said semiconductor chip.

4. A multilayer wiring board according to claim 3, wherein each of the electrode pads corresponding to the electrodes located near said outer periphery has an oval shape, and each of the openings of said solder resist has a circular shape.

* * * * *